United States Patent
Luk Pat et al.

[11] Patent Number: 5,957,843
[45] Date of Patent: Sep. 28, 1999

[54] PARTIAL FLYBACK ECHO-PLANAR IMAGING

[75] Inventors: Gerard T. Luk Pat, Stanford; Craig H. Meyer, Mountain View; John M. Pauly, San Francisco; Dwight G. Nishimura, Palo Alto, all of Calif.

[73] Assignee: Board of Trustees of the Leland Stanford Junior University, Palo Alto, Calif.

[21] Appl. No.: 08/515,090

[22] Filed: Aug. 14, 1995

[51] Int. Cl.⁶ ..................................................... A61B 5/055
[52] U.S. Cl. ........................... 600/410; 600/419; 324/306; 324/309
[58] Field of Search .............................. 128/653.1, 653.2, 128/653.3, 653.4; 324/312, 306, 309; 600/407, 410, 419, 420

[56] References Cited

U.S. PATENT DOCUMENTS

| | | |
|---|---|---|
| 4,767,991 | 8/1988 | Rzedzian .................................. 128/653 |
| 5,647,362 | 7/1997 | Fuderer et al. . |
| 5,652,515 | 7/1997 | Kondo . |
| 5,779,636 | 7/1998 | Kanazawa . |

*Primary Examiner*—Marvin M. Lateef
*Assistant Examiner*—Shawna J Shaw
*Attorney, Agent, or Firm*—Townsend and Townsend and Crew LLP; Henry K. Woodward

[57] ABSTRACT

Flyback imaging is combined with echo planar imaging (EPI) for improved readout flow properties. For increases in imaging time of 50% or less, significant improvements in imaging are realized. The partial flyback improves partial-Fourier EPI and inside-out EPI and can be applied to any EPI trajectory.

8 Claims, 10 Drawing Sheets

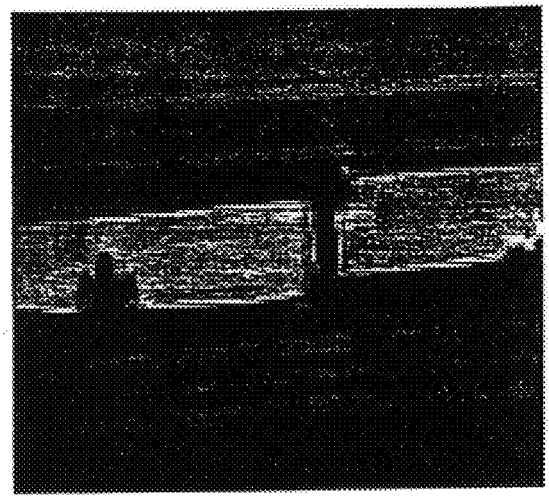
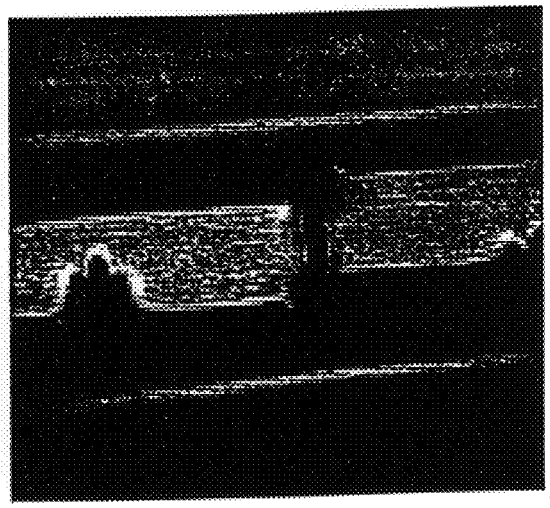
FIG. 12A  FIG. 12B
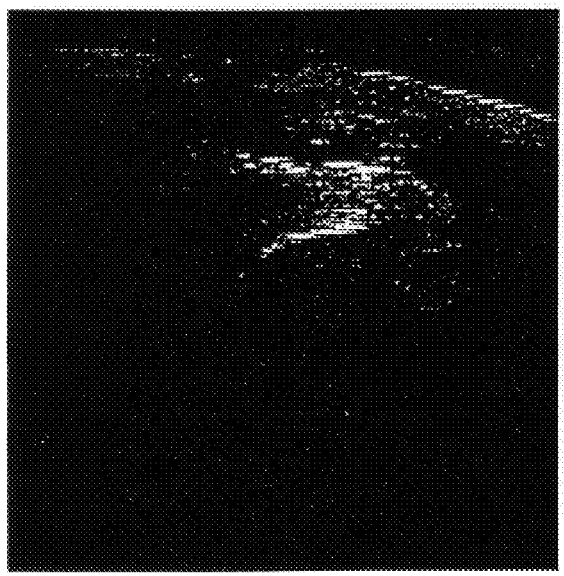
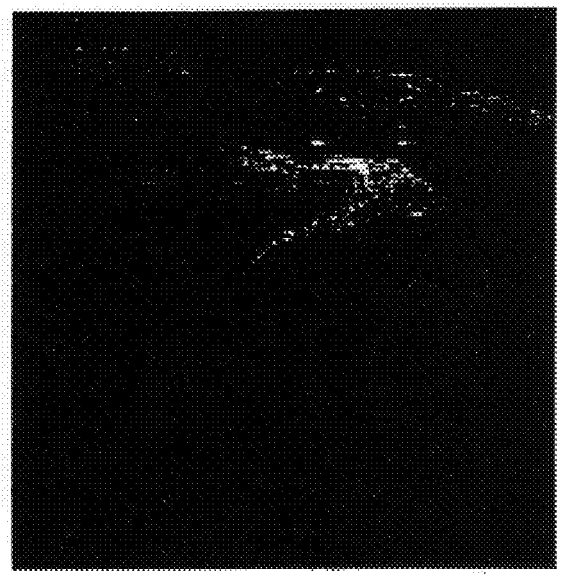
FIG. 13A  FIG. 13B

PARTIAL FLYBACK ECHO-PLANAR IMAGING

This invention was made with U.S. Government support under grant No. HL 39297 awarded to Stanford University by the National Institute of Health. The Government has certain rights in this invention.

BACKGROUND OF THE INVENTION

This invention relates generally to magnetic resonance imaging (MRI) and, more particularly, the invention relates to echo planar imaging using partial flyback.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Echo planar imaging (EPI) uses a gradient scanning of k-space in which data is acquired in both positive and negative directions along one axis ($k_x$) while the scanning is moved incrementally along another axis ($k_y$). As described by Butts and Riederer, "Analysis of Flow Aspects in Echo-Planar Imaging," Journal of Magnetic Resonance Imaging, June 1992, the reversing of scan directions causes blurring, ghosting, and signal loss when material flows in the imaged plane. Artifacts due to flow in the phase-encoded direction can be reduced by using a partial k-space trajectory, as disclosed by McKinnon, "Ultrafast Interleaved Gradient-Echo-Planar Imaging," Magnetic Resonance in Medicine 30:609–616, 1993. Flow artifacts are reduced because there is less phase-encoding before the center of k-space is acquired. The flyback partial Fourier trajectory reduces readout-flow artifacts by acquiring data in only one direction along the readout axis ($k_x$). See Duerk and Simonetti, "Theoretical Aspects of Motion Sensitivity and Compensation in Echo Planar Imaging," JMRI 1991, 1:643–650. However, this approximately doubles the time to acquire an image.

The present invention is directed to a partial-flyback EPI where the flyback trajectory is used at the center of k-space and an echo planar trajectory is used elsewhere in acquiring data.

SUMMARY OF THE INVENTION

In accordance with the invention, imaging time is traded for reductions in flow artifacts in EPI by using a limited flyback trajectory at the center of k-space. Ghosting and signal loss are thus reduced for the important low spatial frequency data. As flyback time is increased, readout flow artifacts are reduced but scan time is increased. However, since the amplitude of the k-space data decreases rapidly away from the origin or center of k-space, the flyback time need only be large enough so that the central region of k-space is acquired with flyback.

The invention and objects and features thereof will be more readily apparent from the following description and appended claims when taken with the drawing.

BRIEF DESCRIPTION OF THE DRAWINGS

FIGS. 12A, 12B are inside-out EPI images without and with partial flyback.

FIGS. 13A, 13B are axial images of the heart acquired with inside-out EPI without and with partial flyback.

DETAILED DESCRIPTION OF ILLUSTRATIVE EMBODIMENTS

Figure 1A:
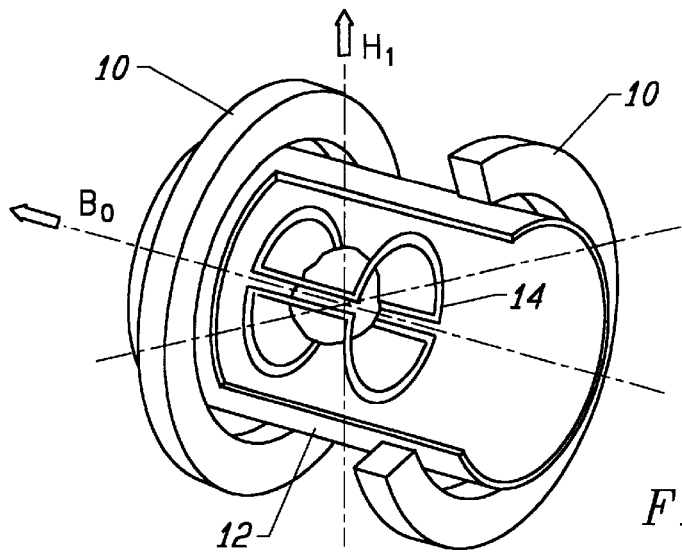
FIGS. 1A–1D illustrate the arrangement of conventional MRI apparatus and magnetic fields generated therein.
Figure 1B:
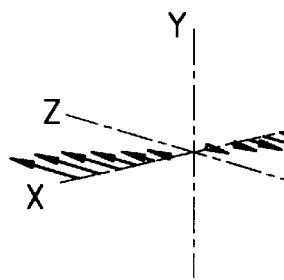
Figure 1C:
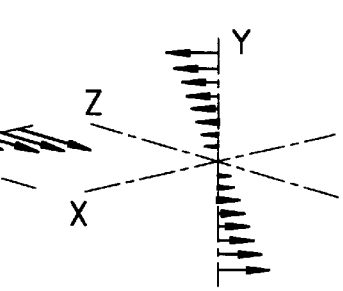
Figure 1D:
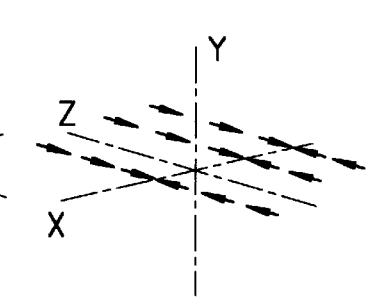

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation,". Proceedings of the IEEE, Vol. 71, No. 3, March 1983, pp. 338–350. Briefly, the uniform static field $B_0$ is generated by the magnet comprising the coil pair 10. A gradient field $G_X$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y and Z axes. FIGS. 1C and 1D are similar representations of the Y gradient and Z gradient fields, respectively.

Figure 2:
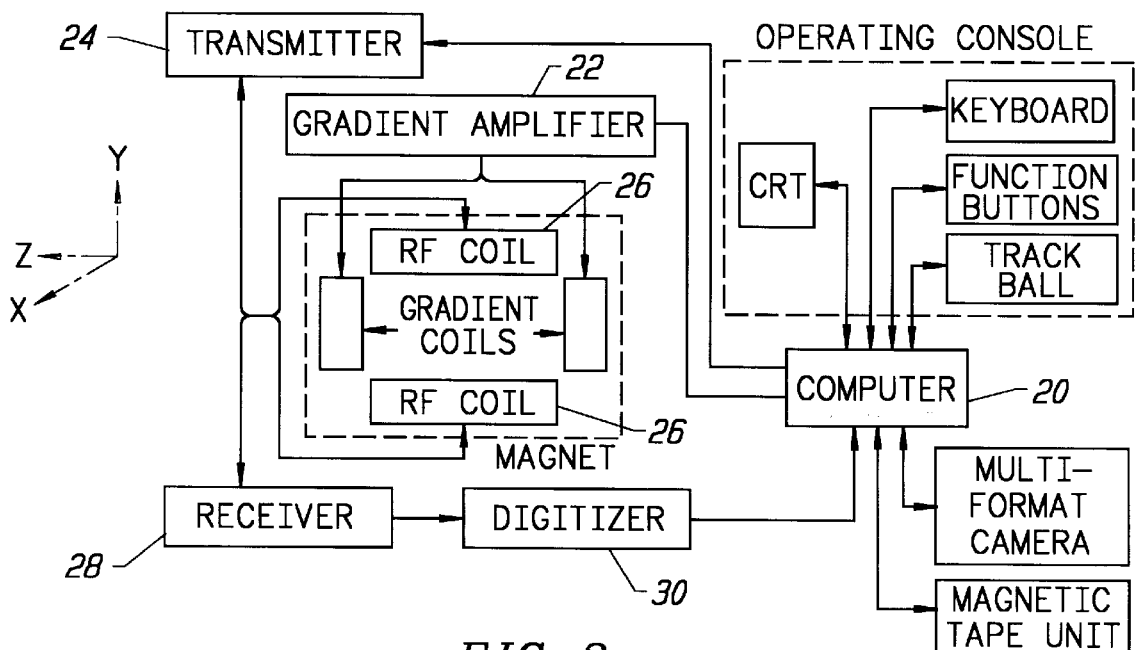
FIG. 2 is a functional block diagram of MRI imaging.

FIG. 2 is a functional block diagram of the imaging apparatus as disclosed in NMR—A Perspective on Imaging, General Electric Company. A computer 20 is programmed to control the operation of the NMR apparatus and process free induction decay (FID) signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
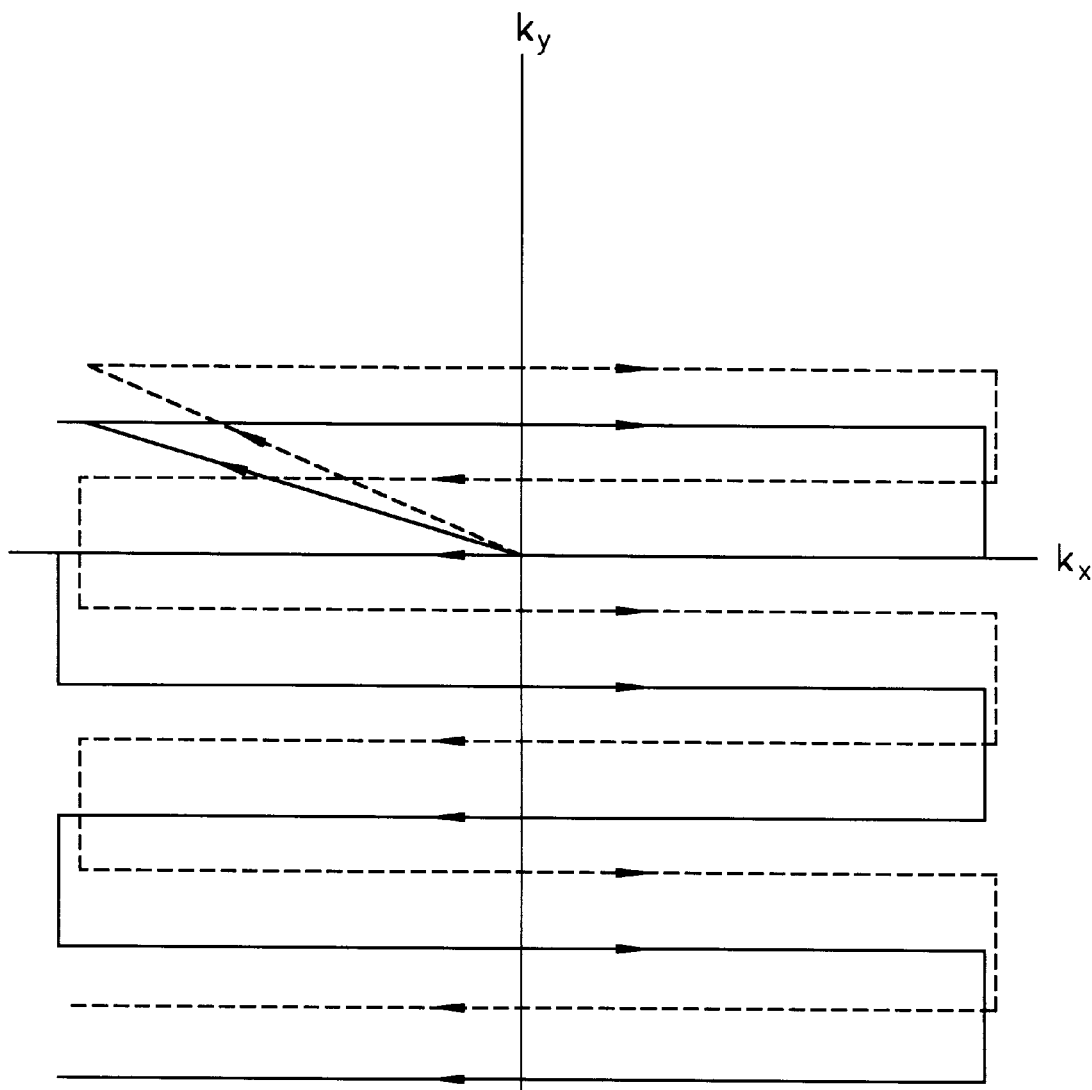
FIG. 3 illustrates partial-Fourier EPI with no flyback.
Figure 4:
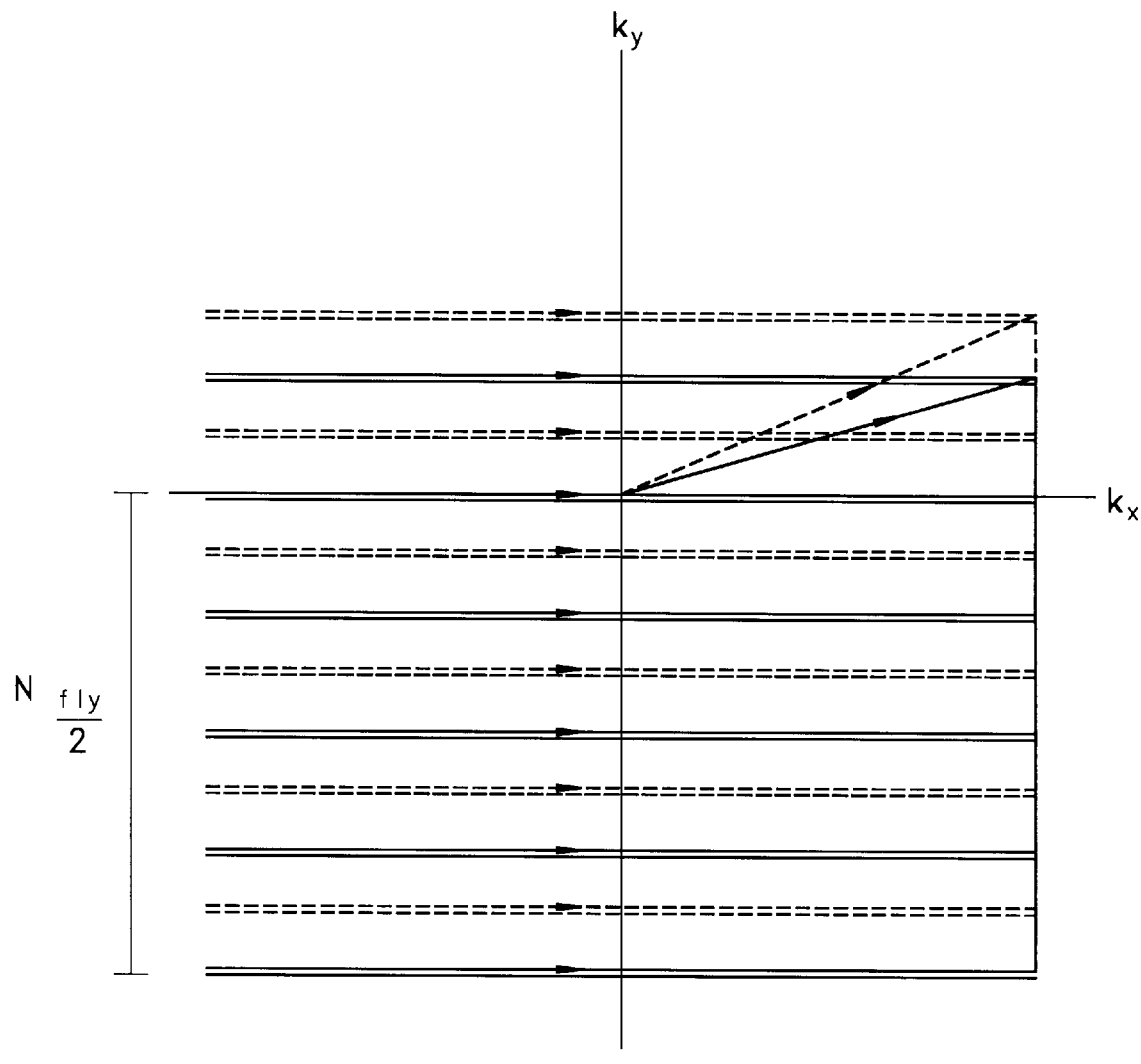
FIG. 4 illustrates partial-Fourier EPI with 100% flyback.

As described above, in echo planar imaging (EPI) flow causes blurring, ghosting, and signal loss. Artifacts due to flow in the phase-encode or $k_y$ direction can be reduced by using a partial k-space trajectory. This is depicted in FIG. 3 and is referred to as "partial-Fourier" EPI. Flow artifacts are reduced because there is less phase-encoding before the center of k-space is acquired. Nevertheless, this trajectory still suffers from flow artifacts due to flow in the readout or $k_x$ direction. Flyback reduces ghosting and signal loss since data is acquired in only one $k_x$ direction. The flyback partial-Fourier trajectory, depicted in FIG. 4, reduces readout-flow artifacts by acquiring data only on alternate echoes. However, this approximately doubles the time to acquire an image.

Figure 5:
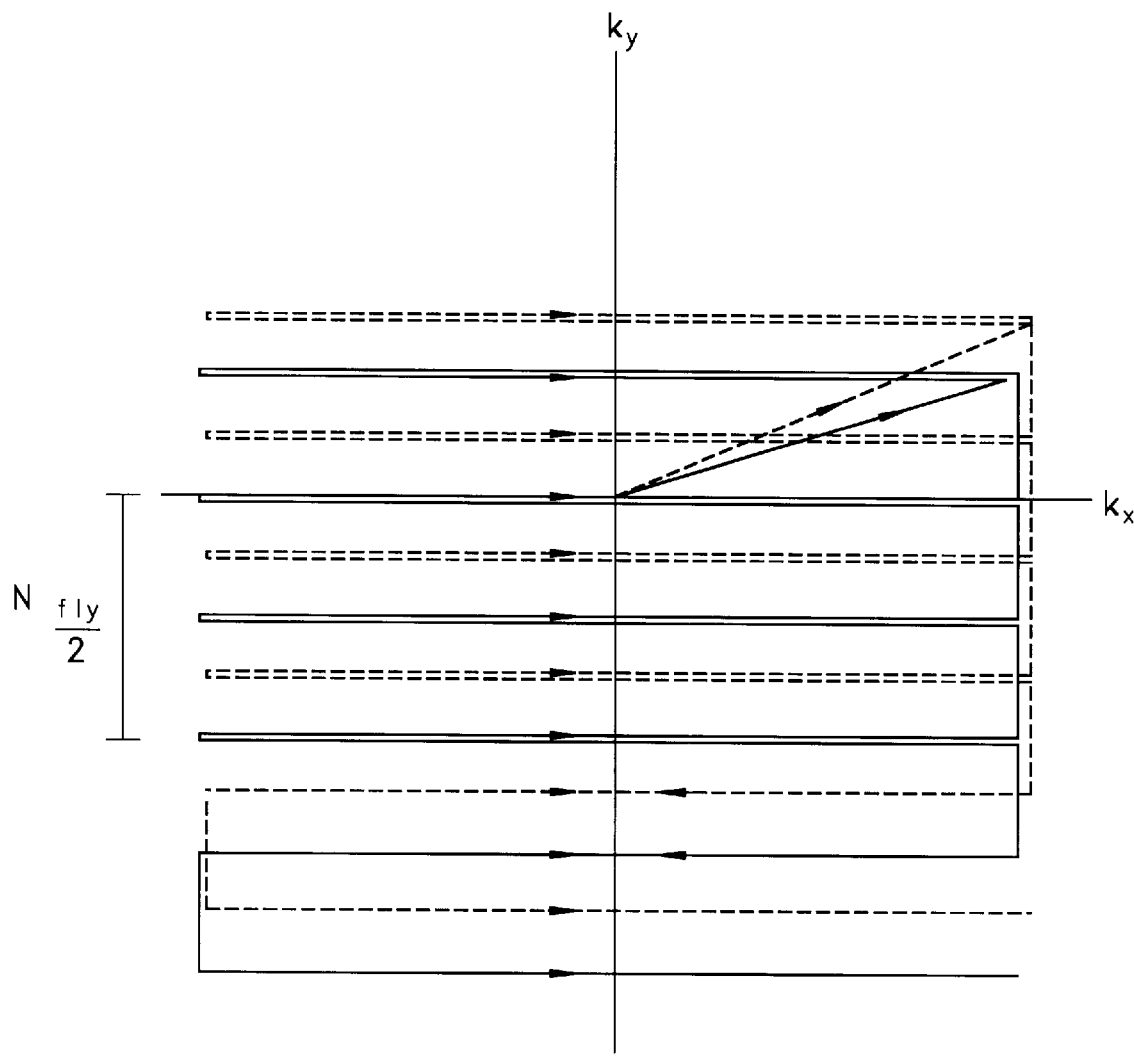
FIG. 5 illustrates partial-Fourier EPI with partial flyback in accordance with the invention.

In accordance with the invention, partial-flyback is used where the flyback trajectory is used at the center of k-space and the echo-planar trajectory is used elsewhere. As shown in FIG. 5, in the bottom-half of k-space, $N_{fly}/2$ data lines are acquired with the flyback trajectory and the rest are acquired with the echo-planar trajectory. (The top-half of k-space is a truncated reflection of the bottom half about $k_y=0$.) By adjusting $N_{fly}$, imaging time can traded for reductions in flow artifacts.

With partial-flyback, ghosting of the important low spatial-frequency data is eliminated. As $N_{fly}$ is increased, readout flow artifacts are progressively reduced. However, since the amplitude of the k-space data decreases rapidly as we move away from the origin, $N_{fly}$ need only be large enough so that the central region of k-space is acquired with flyback. As $N_{fly}$ is increased, there can be some worsening of the phase-encode flow artifacts and off-resonance artifacts. This is because in the flyback region the speed along $k_y$ is only half of that in the EPI region. This has two effects on the spurious phase produced by phase-encode flow and off-resonance. First, it changes its shape. Second, it increases its maximum value. Nevertheless, the reduction of readout-flow artifacts generally outweighs the worsening of phase-encode flow artifacts and off-resonance artifacts.

Figure 6:
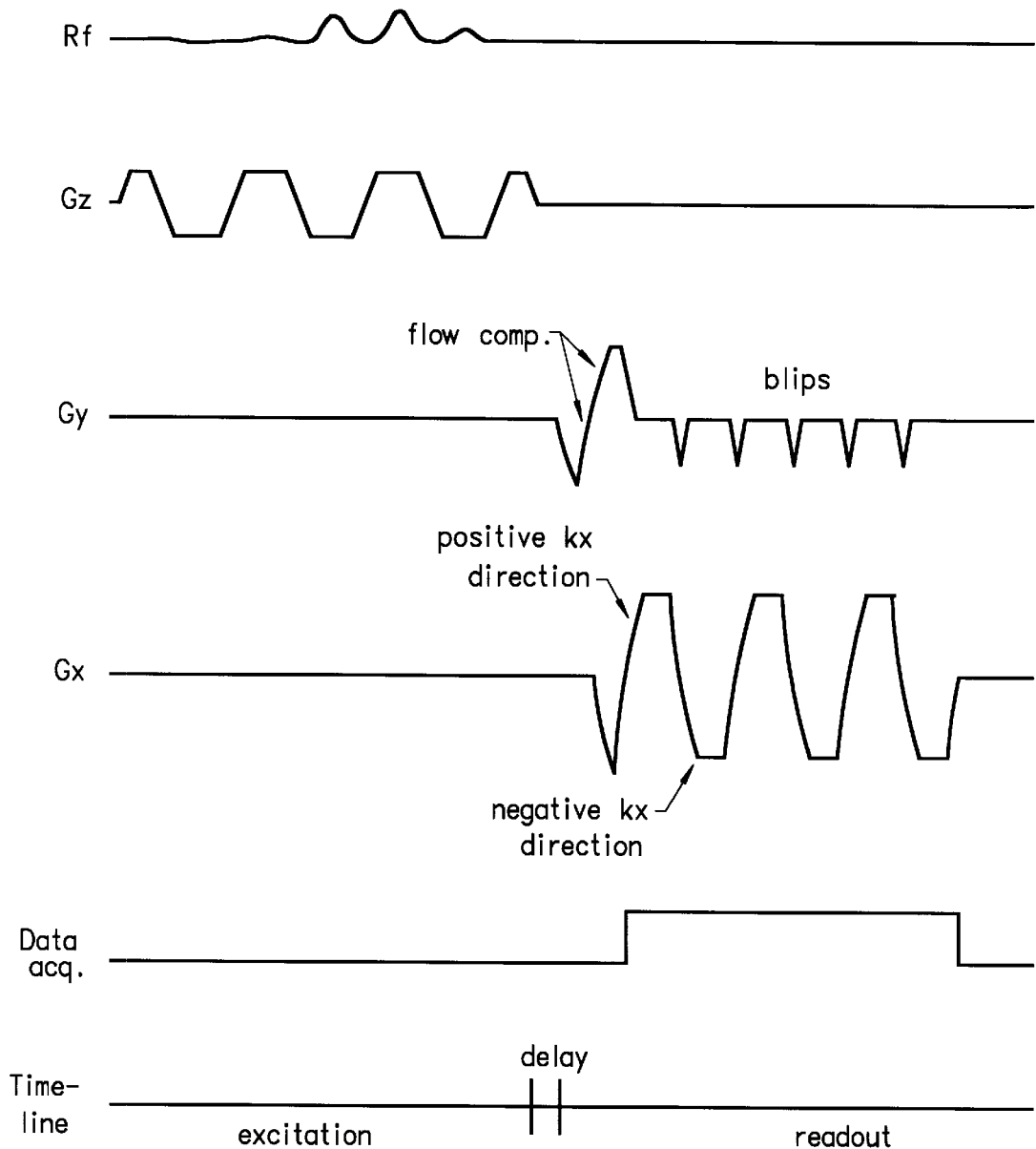
FIG. 6 illustrates excitation and readout gradients for the partial-Fourier EPI without flyback of FIG. 3.

Partial-Fourier EPI with no flyback and with partial-flyback has been implemented on a GE Signa 1.5 T system. FIG. 6 shows the pulse sequence for partial-Fourier EPI with no flyback. The RF and $G_z$ axes depict the spectral-spatial RF excitation used for fat-suppression. The waveform on the $G_y$ axis begins with a bipolar lobe. This is used to reduce signal loss from flow in the phase-encode direction. The bipolar lobe is followed by a series of triangles or "blips." These are used to move along the $k_y$ direction. The $G_x$ waveform begins with a triangular lobe which is used to move to the left edge of k-space, The subsequent trapezoidal lobes are used to move back and forth between the left and right edges of k-space. The Data Acquisition axis shows that the data is acquired during both positive and negative $G_x$ trapezoidal lobes. A readout delay is used to improve off-resonance properties. This delay occurs after the spectral-spatial excitation and is applied to the $G_x$, $G_y$ and DAQ waveforms.

Figure 7:
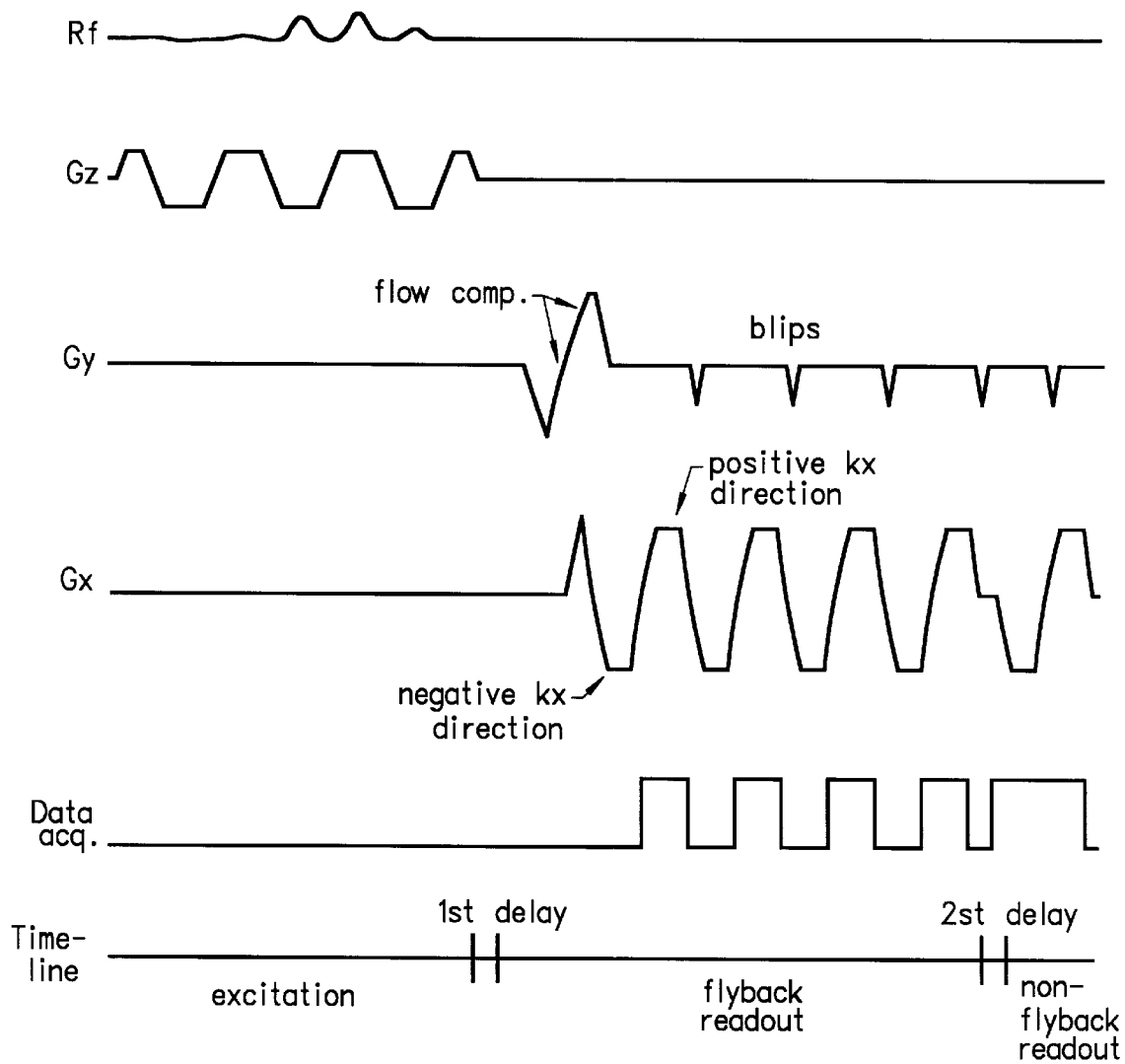
FIG. 7 illustrates excitation and readout gradients for the partial-Fourier EPI with partial flyback of FIG. 5.

FIG. 7 shows the pulse sequence for partial-Fourier EPI with 50% flyback. The RF and $G_z$ axes are the same. However, the DAQ axis now indicates the flyback and EPI regions. For the flyback region, data is acquired only during the positive $G_x$ trapezoids A $G_y$ blip occurs only after a positive $G_x$ trapezoid. For the EPI region, data is acquired during both positive and negative $G_x$ trapezoids. A $G_y$ blip occurs after every $G_x$ trapezoid. For partial-flyback, two readout delays are used. The first delay occurs after the spectral-spatial excitation. The second delay occurs between the flyback and EPI regions.

Figure 8:
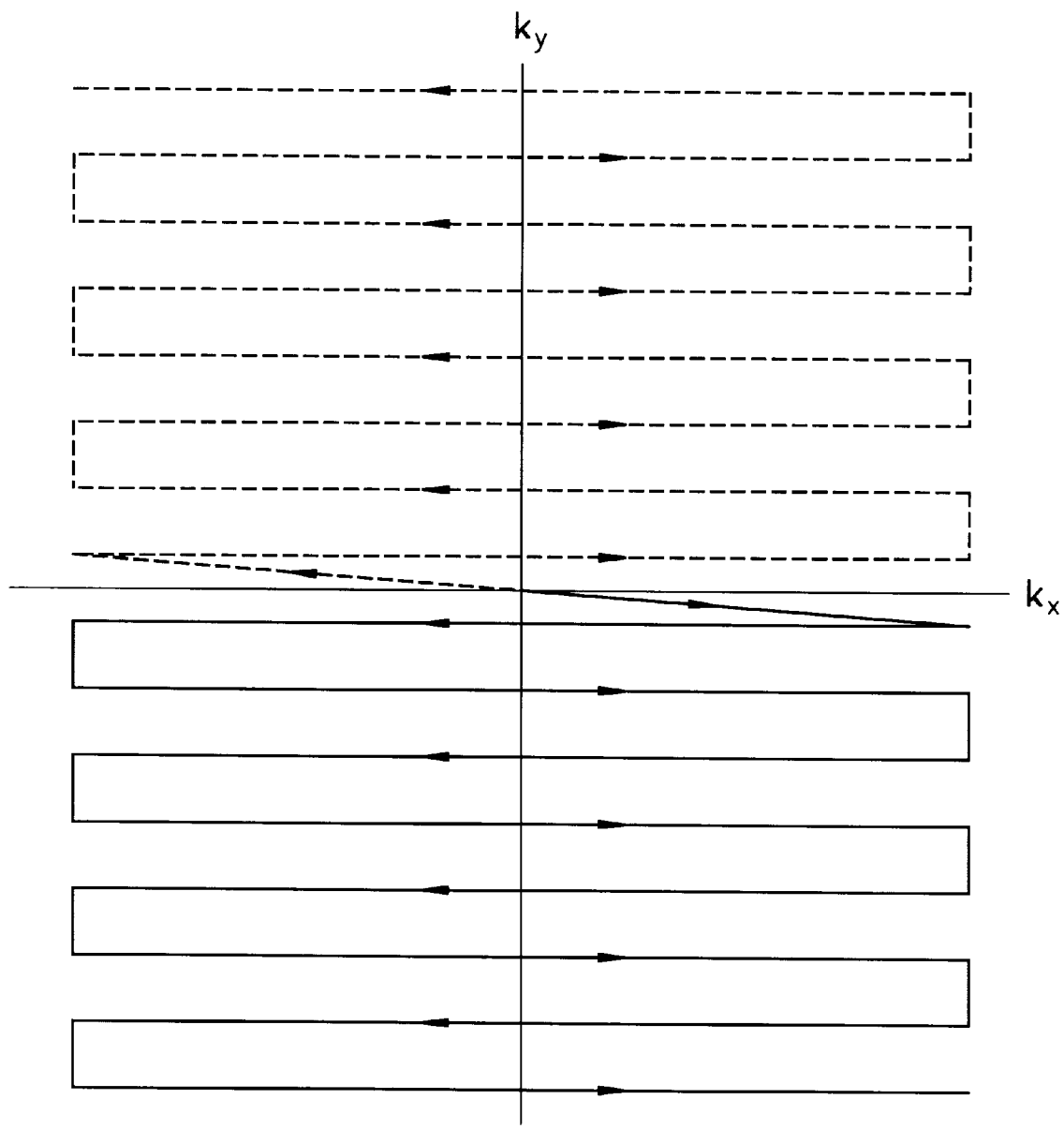
FIG. 8 illustrates inside-out EPI with no flyback.
Figure 9:
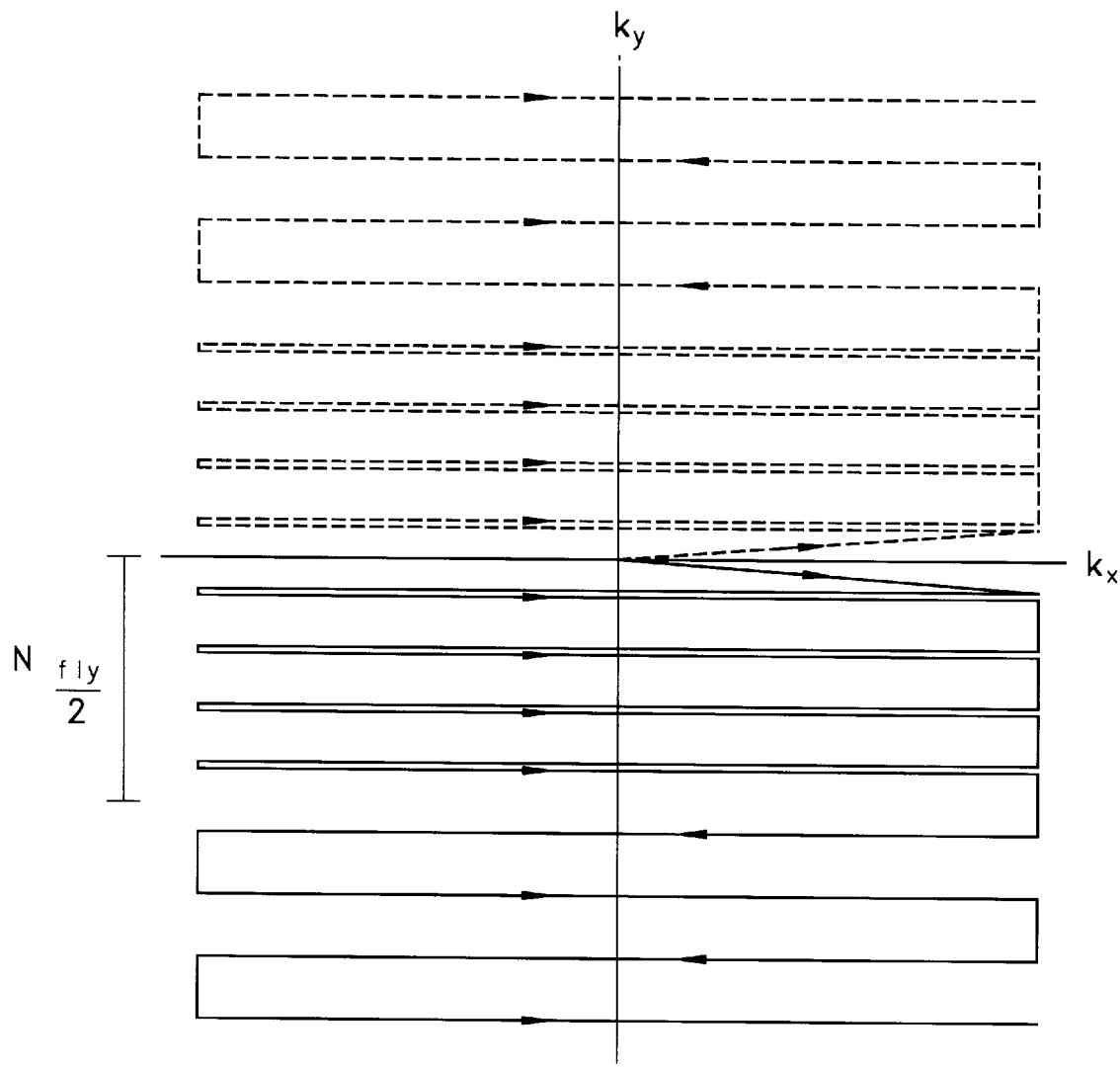
FIG. 9 illustrates inside-out EPI with partial flyback in accordance with the invention.

Partial-flyback can be applied to any EPI trajectory. For example, it can be applied to "inside-out" EPI, depicted with no flyback in FIG. 8 and with partial-flyback in FIG. 9. For this trajectory, data acquisition begins at the center of k-space, with separate RF excitations for acquiring the top and bottom halves of k-space. As with partial-Fourier EPI, phase-encode flow properties are improved because there is less phase-encoding before the center of k-space is acquired.

Images of in-plane flow were acquired on a GE Signa 1.5 T system. Each gradient axis was used with a maximum amplitude of 1.5 G/cm and a slew rate of 2132 G/cm/s.

Figure 10A:
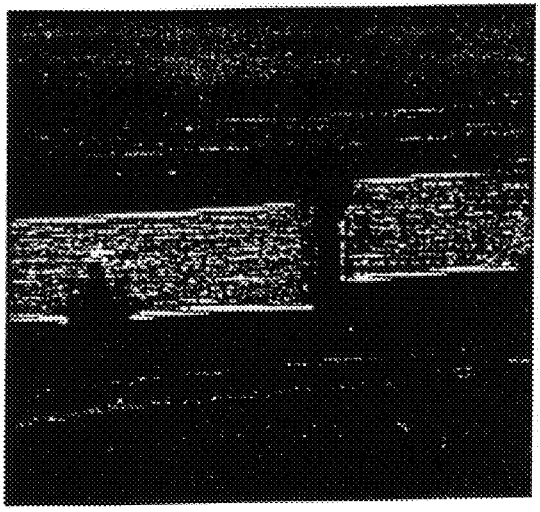
FIGS. 10A, 10B are partial-Fourier EPI images without and with partial flyback.
Figure 10B:
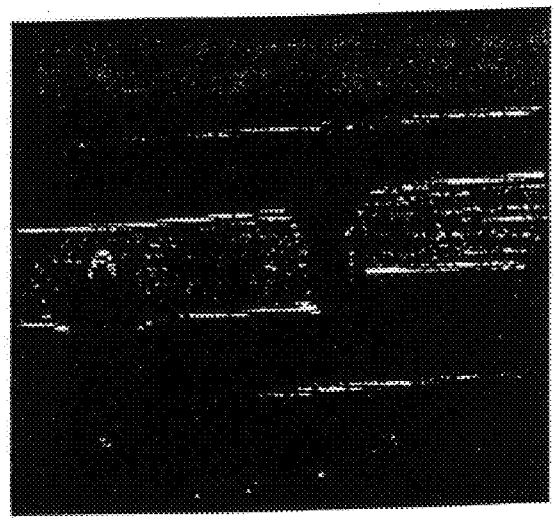

FIGS. 10A, 10B show partial-Fourier EPI images of two bottles and two tubes with flow in the readout direction. The image in FIG. 10A was acquired with no flyback. Because of flow ghosting, each tube is replaced by two strong ghosts and a number of weaker ghosts. The image in FIG. 10B was acquired with 50% flyback and shows a dramatic reduction in the flow ghosting.

Figure 11A:
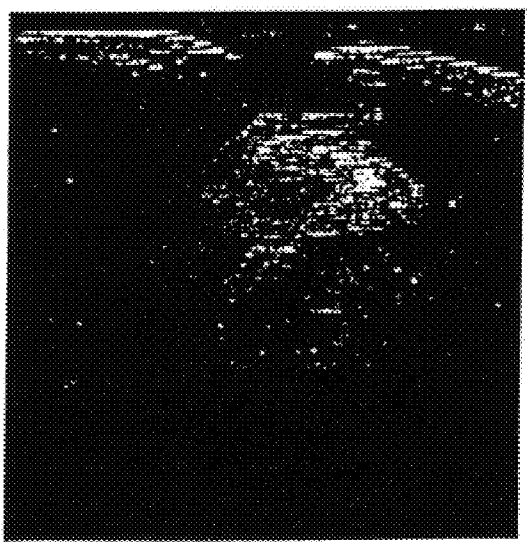
FIGS. 11A, 11B are axial images of the heart acquired with partial Fourier EPI without and with partial flyback.
Figure 11B:
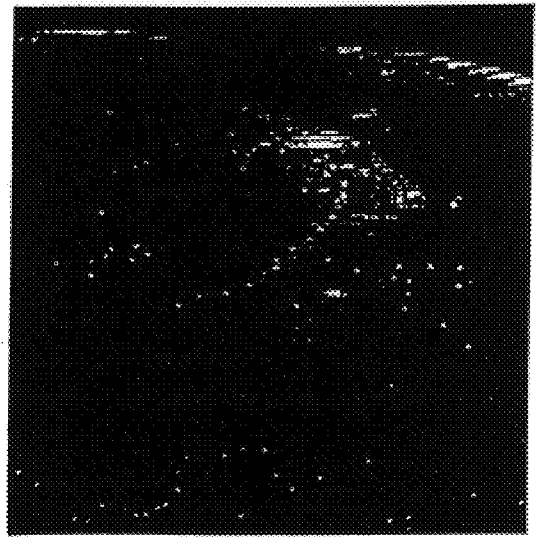

FIGS. 11A, 11B show axial images of the heart acquired with partial-Fourier EPI. In FIG. 11A, readout-flow artifacts appear as signal loss and ghosting along the septum and at the base of the aorta. In FIG. 11B, the use of 50% flyback reduces these artifacts. Around the posterior edge of the heart (towards the bottom of the images), there is more signal loss with partial-flyback. This is because of the worsened phase-encode flow properties. Also, the chest wall shows the inferior off-resonance properties of partial-flyback. Nevertheless, the overall image quality improves with partial-flyback.

The images in FIGS. 12A, 12B are similar to those in FIG. 10 except that inside-out EPI was used. Again, the use of 50% flyback produces a dramatic reduction in flow ghosting. In FIGS. 13A, 13B the images were also acquired with inside-out EPI. In FIG. 13A, read-out flow causes significant signal loss in the heart. In FIG. 13B, the use of 50% flyback virtually eliminates this signal loss.

There have been described several embodiments of the invention. However, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of echo planar magnetic resonance imaging with reduced flow artifacts when material flows in an imaged plane comprising the steps of:

a) selectively exciting nuclei spins in an object to be imaged, b) applying read-out gradients to said object to scan k-space with the scanning parallel to one axis near the origin of k-space being in one direction and elsewhere in k-space scanning parallel to said axis being bidirectional, and c) detecting signals from said nuclei during read-out.

2. The method as defined by claim 1 wherein said scans begin at the origin of k-space and move outwardly in an inside-out trajectory.

3. The method as defined by claim 1 wherein said scans begin away from the origin of k-space and move through the center of k-space using a partial-Fourier trajectory.

4. The method as defined by claim 1 wherein line scans with scanning in said one direction is no greater than 50% of all line scans.

5. Apparatus for imaging nuclei in a plane of an object in which material flows comprising:

a) means for establishing a static magnetic field through said object, b) means for selectively exciting nuclei spins in said object, c) means for applying read-out gradients to said object to scan k-space with the scanning parallel to one axis near the origin of k-space being in one direction and elsewhere in k-space scanning being bidirectional, and d) means for detecting signals from said nuclei during read-out.

6. Apparatus as defined by claim 5 wherein said scans begin at the origin of k-space and move outwardly in an inside-out direction.

7. Apparatus as defined by claim 5 wherein said scans begin away from the origin of k-space and move through the center of k-space in a partial-Fourier trajectory.

8. Apparatus as defined by claim 5 wherein line scans with scanning in said one direction is no greater than 50% of all line scans.

* * * * *